United States Patent [19]

Golab

[11] Patent Number: 4,724,422
[45] Date of Patent: Feb. 9, 1988

[54] REDUNDANT DECODER
[75] Inventor: James S. Golab, Austin, Tex.
[73] Assignee: Motorola, Inc., Schaumburg, Ill.
[21] Appl. No.: 776,187
[22] Filed: Sep. 13, 1985
[51] Int. Cl.$^4$ .............................................. H03M 7/00
[52] U.S. Cl. .............................. 340/347 DP; 365/200
[58] Field of Search ................ 340/347 DP; 365/200; 371/10, 11; 307/219, 449, 403

[56] References Cited

U.S. PATENT DOCUMENTS 4,590,388   5/1986   Clemons .............................. 365/200

Primary Examiner—Charles D. Miller
Attorney, Agent, or Firm—John A. Fisher; Jeffrey Van Myers; James L. Clingan, Jr.

[57] ABSTRACT

A redundant decoder for use in a predecoded memory scheme includes a plurality of predecoding circuits each having an output and each having inputs coupled to selected address signals. The outputs of the predecoding circuits are applied to the inputs of a smaller group of decoding circuit. In addition, the outputs of the predecoding circuits are coupled to the gate electrodes of one of a plurality of series coupled field effect transistors each having a laser blowable fuse coupled across its source drain path. Should one of the decoding circuits prove to be operating improperly, is only necessary to blow the fuses across the individual field effect transistors whose gate electrodes are coupled to the predecoding circuit outputs which served as inputs to the bad gate. In this manner, the output of the stack will go high only when the output of the bad decoding circuit should go high.

9 Claims, 1 Drawing Figure

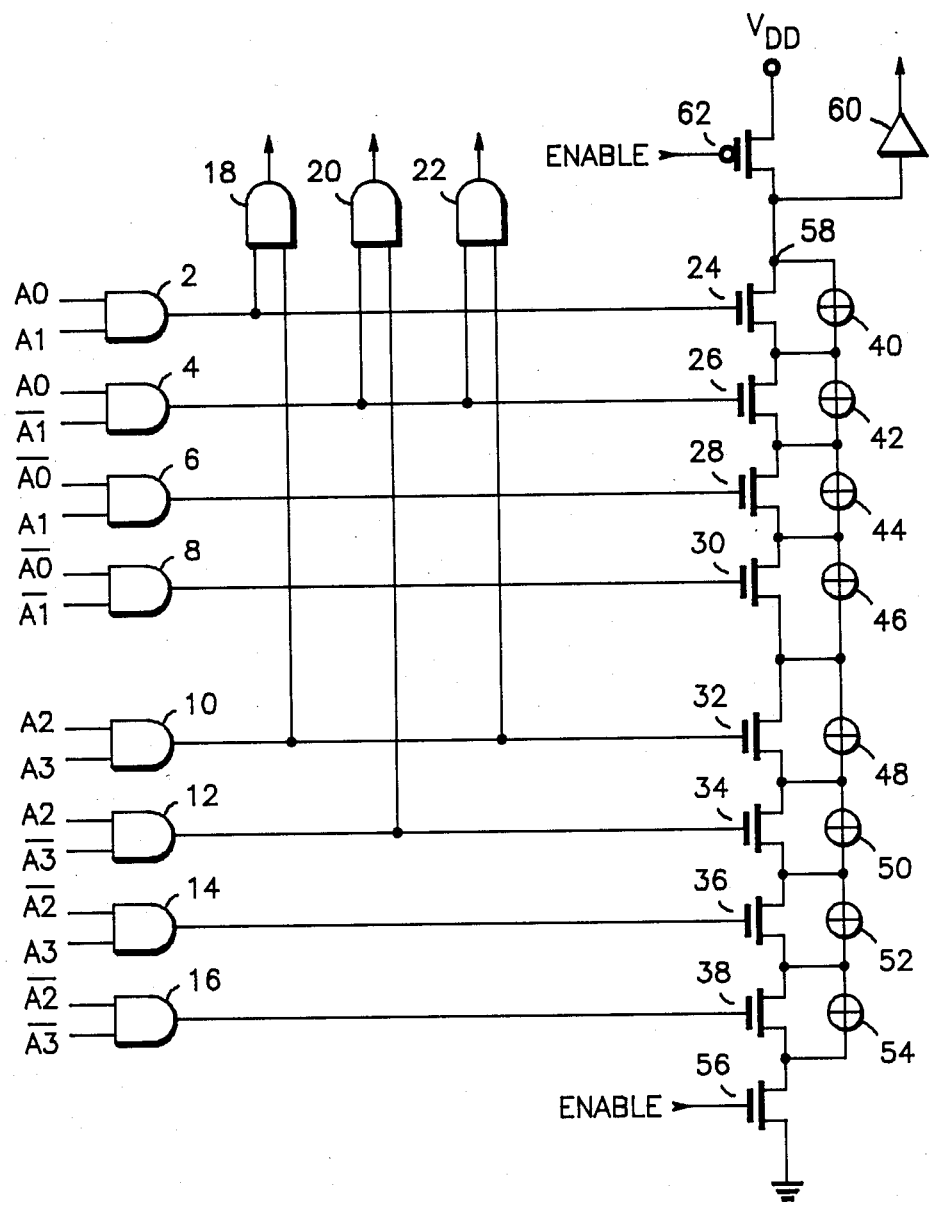

REDUNDANT DECODER

BACKGROUND OF THE INVENTION

This invention relates generally to a decoder for use in integrated circuit memories and the like and, more particularly to a redundant decoder for use in conjunction with a predecoded addressing scheme.

In the manufacture of integrated circuit memories (e.g. MOS memories), many devices fail due to the failure of a single decoding bit. As a result, redundant decoding has become common, and its economic advantage (i.e. higher yield) is well established. It has since been established that the use of predecoders greatly reduces the complexity of the memory's decoding function resulting in the occupation of less space on the semiconductor die. That is, instead of utilizing a decoding scheme wherein all address lines are applied to a single large decoding stage, certain ones of the address lines are applied to a plurality of predecoding gates, the outputs of which are coupled to the inputs of a smaller plurality of decoding gates. The outputs of the decoding gates then control the memory's bit lines.

Since existing redundancy techniques are tailored for use in non-predecoded addressing schemes, a need exists for an improved redundant decoder which predecodes the addresses.

SUMMARY OF THE INVENTION

It is an object of the present invention to provide an improved redundant decoder.

It is a further object of the present invention to provide a redundant decoder for use in conjunction with a predecoded memory schemes.

It is a still further object of the present invention to provide a redundant decoder for use in conjunction with a predecoded memory scheme and occupies little space on the die.

According to a broad aspect of the invention there is provided a decoder for receiving a first plurality of inputs, each of which is capable of assuming at least first and second states, said decoder for determining when each of a subset of said first plurality of inputs is in a desired one of said first and second states, comprising a second plurality of switching devices coupled in series between first and second supply voltage terminals, each having a control terminal coupled to receive one of said first plurality of inputs and a third plurality of selectively removable conducting devices each one coupled in parallel with one of said second plurality of switching devices.

According to a further aspect of the invention there is provided a redundant decoder for use in a memory system, comprising a first plurality of predecoding logic means each having an output and each having at least one input for receiving one of a plurality of address signals capable of assuming at least first and second states; a second smaller plurality of logic means each having an output and each having inputs coupled to selected ones of the outputs of said first plurality of predecodinglogic means; a third plurality of switching devices coupled in series between first and second supply voltage terminals, each having a control terminal coupled to receive one of the outputs of first plurality of predecoding logic means; and a fourth plurality of selectively removable conducting devices each one coupled in parallel with one of said second plurality of switching devices.

BRIEF DESCRIPTION OF THE DRAWING

The above and other objects, features and advantages of the present invention will be more clearly understood from the following detailed description taken in conjunction with the accompanying drawing which is a schematic diagram of the inventive redundant decoder.

DESCRIPTION OF THE PREFERRED EMBODIMENT

Referring to the drawing, a plurality of address signals (e.g. A0, A1, A2, and A3) and their compliments (A0, $\overline{A1}$, $\overline{A2}$, and $\overline{A3}$) each capable of assuming logical high and logical low levels are applied to selected inputs of predecoding gates 2, 4, 6, 8, 10, 12, 14, and 16. That is, A0 and A1 are applied respectively to first and second inputs of predecoding gate 2, A0 and $\overline{A1}$ are applied respectively to first and second inputs of AND gate 4, $\overline{A0}$ and A1 are applied respectively to first and second inputs of AND gate 6, etc.

A second group of logic functions, shown in the drawing as AND gates 18, 20 and 22 each have outputs for controlling, for example, a memory's bit lines, and each have inputs coupled to selected outputs of the predecoding gates. For example, gate 18 has first and second inputs coupled to the outputs of predecoding gates 2 and 10 respectively, gate 20 has first and second inputs coupled to the outputs of gates 4 and 12 respectively, and gate 22 has first and second inputs coupled to the outputs of predecoding gates 4 and 10 respectively. It should be understood that the use of a four bit input address is given by way of example only and that the circuit may be easily extended to accomodate a large number of input signals. Similarly, only three decoding gates, 18, 20, and 22 have been shown for clarity.

If, for example, A0, A1, A2, and A3 are all in a logical high state, the outputs of predecoding gates 2 and 10 will go high causing the output of decoding gate 18 to go high thus selecting an appropriate bit line. If A0, $\overline{A1}$ A2 and $\overline{A3}$ are high, the outputs of gates 4 and 12 will go high causing the output of decoding gate 20 to go high. Similarly, if A0, A1, A2, and A3 are in a logical high state, the outputs of predecoding gates 4 and 10 will go high causing the output of decoding gate 22 to go high and select an appropriate bit line. It may, for example during testing of the device, be determined that gate 22 or something downstream thereof is not functioning properly resulting in, perhaps, an incorrect bit line selection. Thus, it is necessary to provide means for generating an appropriate output when A0, $\overline{A1}$, A2, and A3 are in their logical high ustates (i.e. when the outputs of predecoding gates 4 and 30 go high).

In order to accomplish the above, a plurality of stacked switching devices (e.g. N-channel field effect transistors) 24, 26, 28, 30, 32, 34, 36, and 38 have their current conducting paths (i.e. their source drain paths) coupled in series and each have a gate electrode coupled to the output of one of the predecoding gates. For example, the gate of field effect transistor 24 is coupled to the output of predecoding gate 2, the gate of field effect transistor 26 is coupled to the output of predecoding gate 4, etc. In addition, a selectively removeable conductor (e.g. a laser blowable fuse) 40, 42, 44, 46, 48, 50, 52, and 54) is coupled in parallel (i.e. across the source and drain terminals) with each transistor. An additional switching device 56 (e.g. and N-channel field effect transistor) has a source coupled to ground, a drain coupled to the source of field effect transistor 38 and a gate coupled to an ENABLE signal which when in a logical high state would permit node 58 or the input of inverter 60 to be pulled to ground (a logical low). An additional switching device 62 (e.g. a P-channel field effect transistor) has a source electrode coupled to a source of supply voltage $V_{DD}$, a drain electrode coupled to nodes 58 and to the input of inverter 60, and gate electrode coupled to the ENABLE signal. Thus, if the ENABLE signal goes high, transistor 56 will turn on and transistor 62 will turn off thus permitting node 58 to be pulled to ground. If the ENABLE signal is off, transistor 62 turns on and transistor 56 turns off. This permits node 58 to be pulled up to substantially the supply voltage $V_{DD}$.

If, as stated previously, decoding gate 22 or something downstream thereof were malfunctioning, it would be desirable that a logical high be produced at the output of inverter gate 60 (a logical low at node 58) to replace the incorrect output being generated at decoding gate 22. This may be simply accomplished as follows. If fuses 42 and 48 were blown (i.e. rendered nonconductive) and the ENABLE signal were in a logical high condition turning on transistor 56 and turning off transistor 62, the only time a logical low would appear at nodes 58 corresponds to a coincidence of a logical high at the gate electrodes of transistors 26, and 32 which in turn corresponds to a logical high at the output of predecoding gate 4 and 10. This would cause transistors 26 and 32 to turn on providing a continuous path from ground to node 58, the path consisting of transistor 56, fuses 54, 52, and 50, transistor 32, fuses 46 and 44, transistor 26, and fuse 40. Thus, the generation of a logical high at the output inverter 60 corresponds to a set of inputs at predecoder gate 4 and 10 which correspond exactly to those which would have generated a logical high at the output of decoding gate 22 had it been functioning properly.

In order to disable the redundant portion of the circuit, it is only necessary to pull the ENABLE signal low turning off transistor 56 and turning on transistor 62. In this manner a logical high will be placed at the input of inverter 60 causing its output to go to a logical low.

Thus, the outputs of any one of the decoding gates may be generated at the output of inverter 60 by simply blowing or rendering nonconductive the appropriate fuses. If decoding gate 18 were bad, fuses 40 and 48 would be blown. Similarly, if decoding gate 20 were bad, fuses 42 and 50 would be blown.

It should be appreciated that while the invention has been described in conjunction with a stack of N-channel field effect transistors, the circuit may be easily modified to the use of P-channel devices. Furthermore, the inputs to the redundant portion of the circuit need not necessarily be predecoded address bits. These inputs may be any signals of which a logical combination is desired.

The above description is given by way of example only. Changes in form and details may be made by one skilled in the art without departing from the scope of the invention as defined by the appended claims.

I claim:

1. A redundant decoder for use in a memory system, comprising:
   a first plurality of predecoding logic means each having an output and each having at least one input for receiving one of a plurality of address signals capable of assuming at least first and second states;
   a second smaller plurality of logic means each having an output and each having inputs coupled to selected ones of the output of said first plurality of predecoding logic means;
   a first plurality of switching devices coupled in series between first and second supply voltage terminals, each having a control terminal coupled to receive one of the outputs of said first plurality of predecoding logic means; and
   a plurality of selectively removable conducting devices each one coupled in parallel with one of said second plurality of switching devices.

2. A decoder according to claim 1 wherein the selectively removable conducting devices are fuses which are removed be being blown.

3. A decoder according to claim 1 wherein each of said switching devices is a field-effect transistor having source and drain electrodes and wherein said control terminal comprises the gate electrode of said field-effect-transistor.

4. A decoder according to claim 3 wherein each of said selectively removable conducting devices comprises a laser blowable fuse coupled in parallel between the source and drain electrodes of at least one of said field-effect-transistors.

5. A decoder according to claim 4 further comprising first means for enabling and disabling said first plurality of switching devices.

6. A decoder according to claim 5 wherein said first means comprises:
   voltage pull-down means coupled between said first supply voltage terminal and a first end of said third plurality of series coupled switching devices; and
   voltage pull-up means coupled between said second supply voltage terminal and a second end of said first plurality of series coupled switching devices, said voltage pull-up means and said voltage pull-down means coupled to receive an enable control signal.

7. A decoder according to claim 6 wherein said voltage pull-down means comprises a first field-effect-transistor having a first electrode coupled to said first supply voltage terminal, a second electrode coupled to said first end, and a gate electrode for coupling to said enable control signal.

8. A decoder according to claim 7 wherein said voltage pull-up means comprises a second field-effect-transistor having a first electrode coupled to said second supply voltage terminal, a second electrode coupled to said second end, and a gate electrode for coupling to said enable control signal.

9. A decoder according to claim 8 wherein each of said first plurality of switching device and said first field-effect-transistor are of the N-channel type, and said second field-effect-transistor is of the P-channel type.

* * * * *